(12) United States Patent
Yen et al.

(10) Patent No.: US 11,830,700 B2
(45) Date of Patent: *Nov. 28, 2023

(54) REPELLENT ELECTRODE FOR ELECTRON REPELLING

(71) Applicant: Taiwan Semiconductor Manufacturing Co., Ltd., Hsinchu (TW)

(72) Inventors: Ching-Heng Yen, Hsinchu (TW); Jen-Chung Chiu, Hsinchu (TW); Tai-Kun Kao, Hsinchu (TW); Lu-Hsun Lin, Hsinchu (TW); Tsung-Min Lin, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/693,103

(22) Filed: Mar. 11, 2022

(65) Prior Publication Data

US 2022/0199351 A1    Jun. 23, 2022

Related U.S. Application Data

(63) Continuation of application No. 16/698,072, filed on Nov. 27, 2019, now Pat. No. 11,295,926.

(60) Provisional application No. 62/772,424, filed on Nov. 28, 2018.

(51) Int. Cl.
  *H01J 37/08* (2006.01)
  *H01J 37/317* (2006.01)
  *H01J 37/32* (2006.01)

(52) U.S. Cl.
  CPC .......... *H01J 37/08* (2013.01); *H01J 37/3171* (2013.01); *H01J 37/32541* (2013.01)

(58) Field of Classification Search
  CPC ... H01J 37/08; H01J 37/3171; H01J 37/32541
  See application file for complete search history.

(56) References Cited

U.S. PATENT DOCUMENTS 11,295,926 B2 *  4/2022  Yen ................... H01J 37/32541
2012/0252195 A1  10/2012  Jones et al.

\* cited by examiner

*Primary Examiner* — Nicole M Ippolito
*Assistant Examiner* — Hanway Chang
(74) *Attorney, Agent, or Firm* — Seed IP Law Group LLP

(57) ABSTRACT

The current disclosure is directed to a repellent electrode used in a source arc chamber of an ion implanter. The repellent electrode includes a shaft and a repellent body having a repellent surface. The repellent surface has a surface shape that substantially fits the shape of the inner chamber space of the source arc chamber where the repellent body is positioned. A gap between the edge of the repellent body and the inner sidewall of the source arc chamber is minimized to a threshold level that is maintained to avoid a short between the conductive repellent body and the conductive inner sidewall of the source arc chamber.

20 Claims, 5 Drawing Sheets

REPELLENT ELECTRODE FOR ELECTRON REPELLING

BACKGROUND

Ion implantation is a semiconductor wafer fabrication process by which ions of an element are accelerated and implanted into target regions on a wafer, thereby adjusting the electrical properties of the target regions on the wafer. Besides semiconductor device fabrication, ion implantation is also used in metal surface finishing and material preparations to improve the mechanical, chemical and/or electrical properties of the targets receiving the implanted ions. For example, the ions implanted into a target can alter the elemental composition of the target, and can also cause changes in chemical and physical property via the energy impinged into the target together with the ions.

Ion implantation may be achieved through ion implanters. An ion implanter usually include a source arc chamber in which an electrical discharge interacts with a gas to create a plasma of a variety of ion species, including a desired ion specie to be impinged into a target, e.g., a target region on a semiconductor wafer. The ion species are extracted from the source arc chamber and are then filtered to obtain the desired ion species. The desired ion species are further accelerated and directed to the target for implanting.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
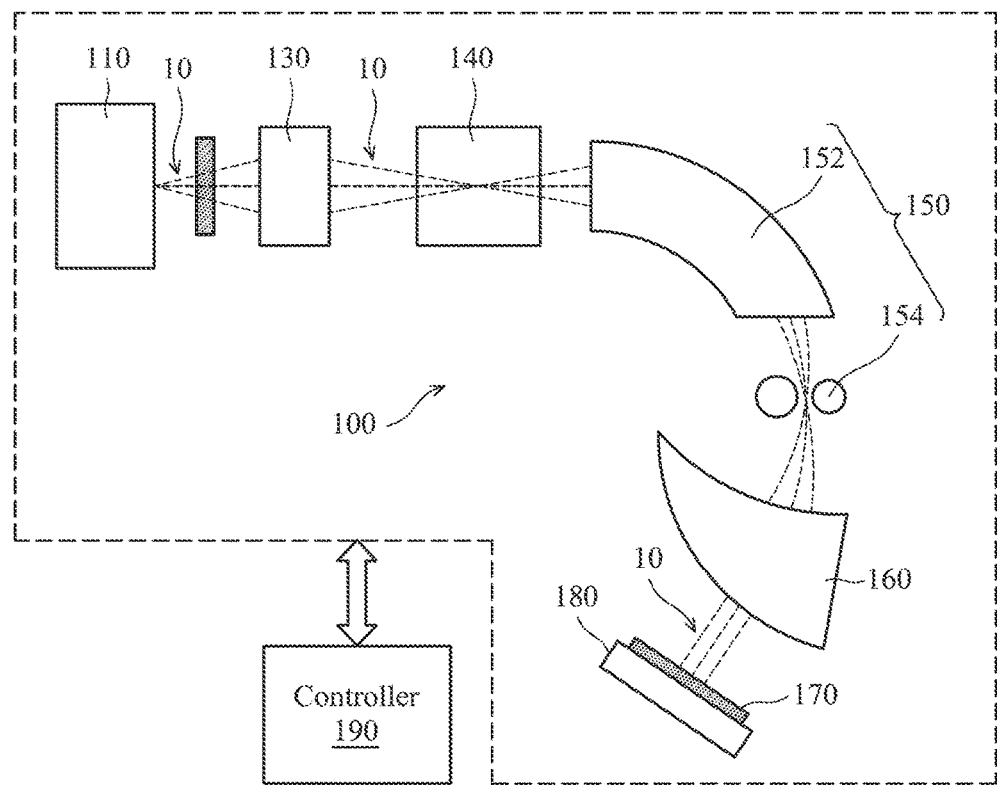
FIG. 1 illustrates, in a schematic view, an ion implanter.

It is to be understood that the following disclosure provides many different embodiments, or examples, for implementing different features of the present disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

The current disclosure is directed to a repellent electrode used in a source arc chamber of an ion implanter. The repellent electrode includes a shaft and a repellent body having a repellent surface. The repellent surface has a surface shape that substantially mirrors the shape of the inner chamber space of the source arc chamber where the repellent body is positioned. A gap between the edge of the repellent body and the inner sidewall of the source arc chamber is minimized to a threshold level that is maintained to avoid short between the conductive repellent body and the conductive inner sidewall of the source arc chamber. In some embodiments, the gap has a substantially uniform dimension in different directions. That is, the shape of the repellent surface substantially matches or mirrors the shape of a transversal plane of the inner chamber space where the repellent surface is positioned, while the repellent surface has a slightly smaller dimension than the transversal plane of the inner chamber space. For example, in a case the transversal plane of the inner chamber space is round, the repellent surface is a round having a smaller diameter, e.g., a diameter about 1 mm to about 3 mm smaller than that of the inner chamber space. In a case the transversal plane of the inner chamber space is square, the repellent surface is substantially a smaller square, e.g., having a side about 1 mm to about 3 mm smaller than a side of the transversal plane. In a case the transversal plane of the inner chamber space is rectangular, the repellent surface is substantially a smaller rectangular, e.g., having each side about 1 mm to about 3 mm smaller than the corresponding side of the transversal plane. If the transversal plane of the inner chamber space is oval, the repellent surface is a smaller oval. When the shape of the repellent surface mirrors or matches the shape of transversal plane of the inner chamber space of the source arc chamber, the effective surface for repelling thermal electrons is increased, which thus increases the odds that an electron is repelled back by the repellant electrode. Increasing the number of electrons repelled by the repellent electrode results the gas in the arc chamber being ionized more efficiently.

FIG. 1 depicts, in a schematic manner, an ion implanter system 100. The system 100 is housed in a high-vacuum environment 102. The ion implanter system 100 may comprise an ion source module 110, an extraction module 120, an ion filtering module 130, an ion acceleration/deceleration module 140, an ion analyzer module 150 including analyzer magnets 152 and a beamguide 154, and a corrector module 160. In operation, a dopant gas (also referred to as "precursor gas") that contains the desired elements to be implanted into a target 170, e.g., a semiconductor wafer, is electrically excited in the ion source module 110 to generate ions. Ions 10 generated by the ion source module 110 are extracted out of the ion source module 110 by the extraction module 120 and then pass through the ion filtering module 130 to filter out contaminant particles. The ions 10 are then accelerated or decelerated, by the ion acceleration/deceleration module 140 into the ion analyzer module 150. The ion analyzer module 150 sorts out or rejects ions of an inappropriate charge-to-mass ratio. For example, the ion analyzer module 150 includes analyzer magnets 152 and a beamguide 154. The beam guide 154 (or a resolving slit) includes curved sidewalls into which ions of an undesired mass-to-charge ratio collide as they are propagated through the beam guide 154 by one or more magnetic fields generated by the magnet(s) of the analyzer magnets 152. As such, only the desired ion species 10 pass through the beam guide 154 and then the corrector module 160. The corrector module 160 shapes the profile of the beam 10 of the desired ion species before they hit the target 170 held on an end station 180.

The ion implanter system 100 also includes a controller 190 that controls the operation of one or more components of the ion implanter system 100.

Figure 2A:
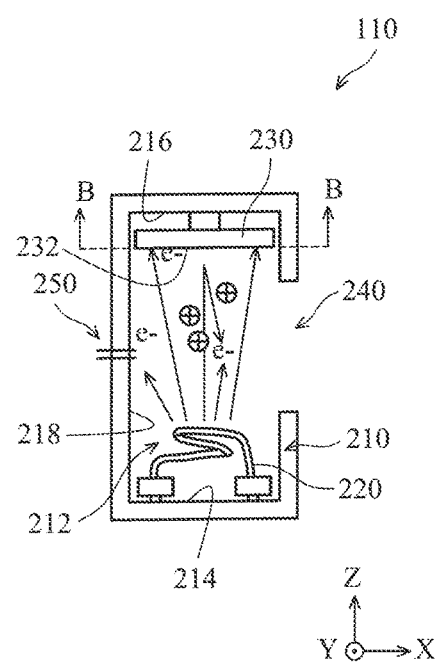
FIG. 2A is an exploded side view of an example ion source module.

FIG. 2A shows an exploded side cross-sectional view, e.g., in the x-z plane, of an example ion source module 110. As shown in FIG. 2A, the ion source module 110 includes a source arc chamber 210 defining an inner chamber space 212. Specifically, the inner chamber space 212 is surrounded by two opposing end walls 214, 216 and one or more sidewall 218 of the source arc chamber 210. A cathode electrode 220 and a repellent electrode 230 are positioned within the inner chamber space 212, in some embodiment, each adjacent to an end wall 214, 216, respectively, as shown in FIG. 2A. It should be appreciated that other arrangements of the cathode electrode 220 and/or the repellent electrode 230 are also possible and included in the disclosure. For example, the cathode electrode 220 may be positioned on the sidewall 218 of the source arc chamber 210. An aperture 240 and a gas inlet 250 are positioned on the sidewall 218 of the source arc chamber.

Dopant gas Gas is introduced into the inner chamber space 212 through the gas inlet 250 and stays substantially uniformly within the inner chamber space 212.

The cathode electrode 220 normally includes or is coupled with, either as an integrated part or as a separate element, a filament element. FIG. 2A shows the cathode electrode 220 as a filament element for illustrative purposes, which does not limit the shapes or configurations of the cathode electrode 220. The filament element is connected to a power supply (not shown) to heat the cathode electrode via electron bombardment to achieve thermionic emission of electrons e⁻. The generated electrons e⁻ are attracted away from the cathode electrode through one or more of the electric fields of the end walls 214, 216 and the sidewall 218 or the repelling potential of the cathode electrode 220. In some embodiments, a magnetic field is also created within the inner chamber space 212 which drives the electrons to travel toward the repellent electrode 230.

The repellent electrode 230 includes a repellent surface 232 that faces away from the end wall 216 that is adjacent to the repellent electrode 230 and faces toward the electrons e⁻ travelling from the cathode electrode 220. The repellent surface 232 includes an electrical conductive material that is connected to a power supply to generate an electric potential designed to repel the electrons e⁻. For example, because the electrons e⁻ include negative charges, the repellent surface 232 is configured to generate a negative potential to repel the electrons e⁻. In some embodiments, the cathode electrode 220 may also include a negative potential to repel the electrons e⁻ away from the cathode electrode 220. As such, the travelling of the electrons e⁻ back and forth between the cathode electrode 220 and the repellent electrode 230 increases the odds that the electrons collide into and interact with the dopant gas Gas in the inner chamber space 212. Such interactions generate a plasma of multiple ion species including the ion species desired to be implanted into the target 170, e.g., a semiconductor wafer.

The generated ion species are extracted from the source arc chamber 210 through the aperture 240.

The electrons e⁻ that are "missed" by the repellent surface 232 will not be repelled back to interact with the dopant gas Gas and will be absorbed by one or more of the end wall 216 or the sidewall 218. To increase the odds that electrons e⁻ are repelled back by the repellent surface 232, the current disclosure provides a repellent surface 232 that substantially fits a transversal plane of the inner chamber space 212 where the repellent surface 232 is positioned at.

Figure 2B:
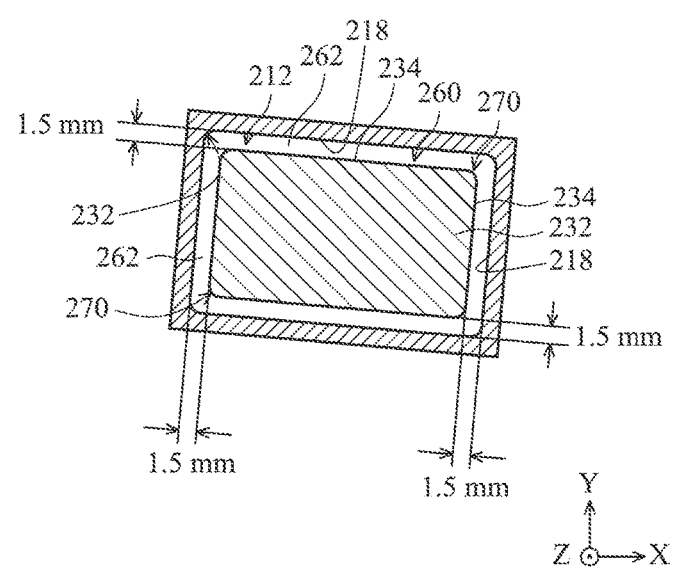
FIG. 2B is a transversal sectional view of the example ion source module of FIG. 2A.

FIG. 2B shows a transversal sectional view of the source arc chamber 210, from cutting line B-B in FIG. 2A, and the repellent surface 232. As shown in FIG. 2B, a shape of the repellent surface 232 substantially mirrors or matches a shape of the inner chamber space 212 in the transversal cross-sectional plane B-B. In the description herein, the shape of the inner chamber space 212 in the transversal cross-sectional plane B-B is referred to as "the transversal plane 260" for description purposes. In FIG. 2B, it is shown, as an illustrative example, that the transversal plane 260 is orthogonal to the sidewall 218 of the inner chamber space 212. This illustrative example does not limit the scope of the disclosure. In some embodiments, the transversal plane 260 is defined as a plane within the inner chamber space 212 along which the repellent electrode 230 is positioned. In a case that the repellent electrode 230 is positioned with an angle (other than 90 degree) to the sidewall 218, the transversal plane 260 also has a same angle with respect to the sidewall 218. In some embodiments, the shape of the repellent surface 232 substantially matches or mirrors the shape of the transversal plane 260, while the repellent surface 232 has a smaller dimension than the transversal plane 260. For example, as shown in FIG. 2B, the repellent surface 232 is smaller than the transversal plane 260 by about 2 mm to about 4 mm in the x-axis direction, e.g., a gap space 262 of about 1 mm to about 2 mmmm separating an edge of the repellent surface 232 from the sidewall 218 of the source arc chamber 210 at each side of the repellent surface 232 in the x-axis direction. The repellent surface 232 is smaller than the transversal plane 260 by about 2 mm to about 4 mm in the y-axis direction, e.g., the gap space 262 of about 1 mm to about 2 mm separating an edge of the repellent surface 232 from the sidewall 218 of the source arc chamber 210 at each side of the repellent surface 232 in the y-axis direction. In some embodiments, the gap space 262 between the sidewall 218 and an edge 234 of the repellent electrode 230 is minimized to a lower threshold size such that the surface area of the repellent surface 232 is maximized. The lower threshold size of the gap space 262, here about 1 mm to about 2 mm, is maintained to avoid undesirable contact or short between an edge of the repellent electrode 230 and the source arc chamber 210, or specifically the sidewall 218 of the source arc chamber 210. The range of about 1 mm to about 2 mm is critical to ensure that the repellent electrode 230 is positioned within the inner chamber space 212 without physically contacting the sidewall 218. FIG. 2B shows that the transversal plane 260 of the inner chamber space 212 and the repellent surface 232 are both substantially rectangular, which is an illustrative example and does not limit the scope of the disclosure.

The transversal plane 260 of the inner chamber space 212, or the internal sidewall 218, may include different shapes or profiles. The repellent surface 232 may also include different shapes that match or mirror the shapes or profiles of the transversal plane 260. An surface area of the repellent surface 232 is smaller than a surface area of the transversal plane 260. For example, in a case the transversal plane 260 of the inner chamber space 212 is round in shape, the repellent surface 232 is also round with a smaller dimension, e.g., having a diameter about 2 mm to about 4 mm smaller than a diameter of the round transversal plane 260. In a case the transversal plane 260 of the inner chamber space 212 is substantially a square, the repellent surface 232 is also a square that is smaller in dimension, e.g., having each side about 2 mm to about 4 mm smaller than the corresponding side of the transversal plane 260. The transversal plane 260 and the repellent surface 232 may also be other polygonal shapes, oval shapes, or irregular shapes.

In accordance with disclosed embodiments, the repellent surface 232 fits within the transversal plane 260 with a minimized gap space 262 separating the repellent surface 232 from the sidewall 218. In some embodiments, the size of the gap space 262, measured as a distance between a point at the edge 234 of the repellent electrode 230 and a nearest point at the sidewall 218, is substantially consistent or uniform at various directions and for various points at the edge 234. A basis for this substantially uniform gap size of the gap space 262 is that the gap space 262 is similarly minimized at various directions. In some embodiments, a size of the gap 262 is smaller than 2 mm to ensure that the size of the repellent surface 232 is sufficiently large to enhance repelling of the electrons e⁻. In some embodiments, a size of the gap 262, i.e., a distance between the repellent electrode 230 and the sidewall 218, is in a range between about 1 mm to about 2 mm such that the size of the repellent surface 232 is sufficiently large to enhance repelling of the electrons e⁻ and the gap 262 is sufficiently large to avoid an edge of the repellent electrode 230 contacting the sidewall 218.

In some embodiments, a polygonal repellent surface 232 includes a rounded corner portion 270. The rounded corner portion 270 is designed to improve the electrical properties of the polygonal repellent surface 232. For example, the rounded corner portion 270 is less likely to cause point discharge. In some embodiment, the internal corner 272 of the sidewall 218 is also rounded. That is, the transversal plane 260 also includes rounded corners. The rounded corner portion 270 substantially fits the rounded internal corner 272 of the sidewall 218 to minimize the gap space 262 at the rounded internal corner 272.

Figure 3:
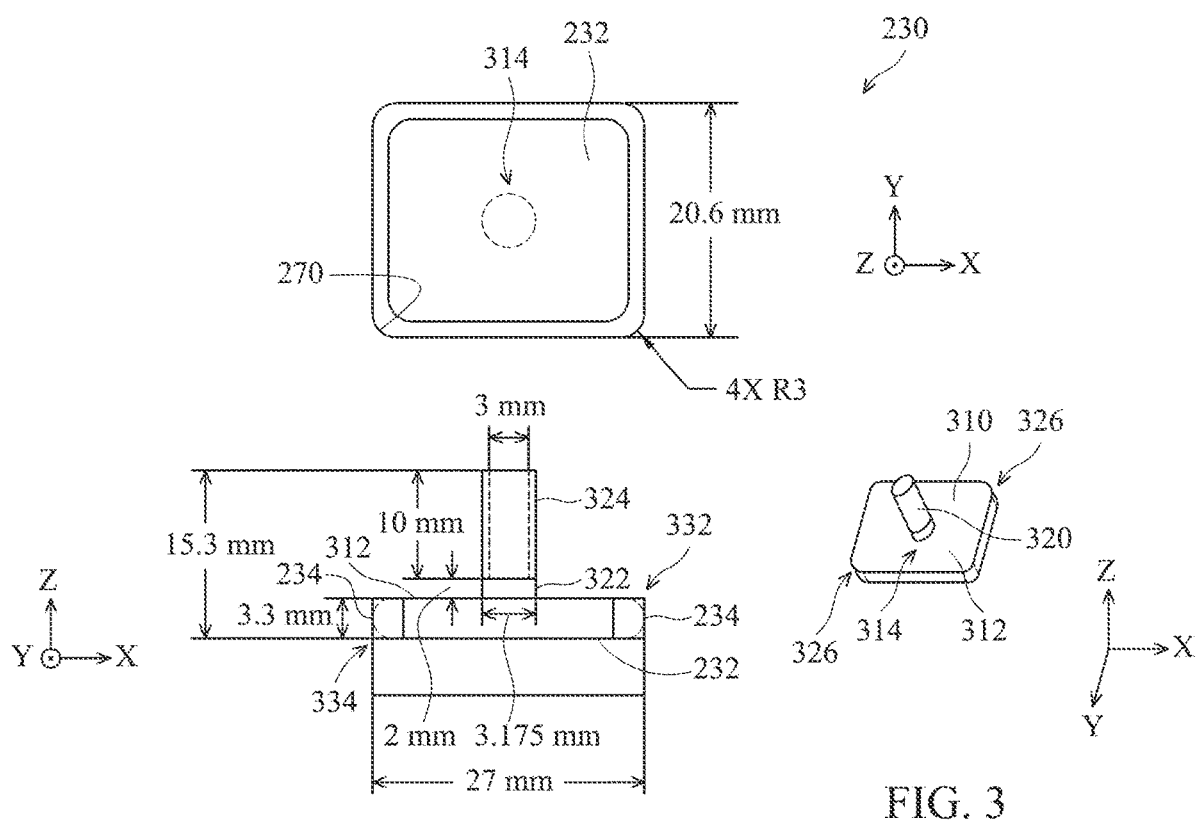
FIG. 3 is an example repellent electrode.

FIG. 3 is an example repellent electrode 230. FIG. 3 includes a top view, a side view and a prospective view of the repellent electrode 230. The example repellent electrode 230 includes a repellent body 310 and a shaft 320. The repellent body 310 includes a repellent surface 232, a repellent edge 234 and a back surface 312. In some embodiments, the shaft 320 is positioned at a center 314 of the back surface 312 of the repellent body 310. The repellent body 310 is made of an electrical conductive material, e.g., tungsten or other suitable conductive materials like titanium alloy. The shaft 320 includes a first portion 322 that is configured to be positioned within the inner chamber space 212 and a second portion 324 that is configured to extend through the end wall 216 (FIG. 2) of the source arc chamber 210 and be coupled with an anchoring element (not shown) that secures the repellent electrode 230 onto the source arc chamber 210. The anchoring element is an insulator, e.g., a ceramic material. One or more of the first portion 322 or the second portion 324 is made of an insulator material, e.g., a ceramic material like aluminum oxide. In an example embodiment, the first portion 322 is about 2 mm in length and the second portion is about 10 mm in length. The first portion 322 may have a diameter of about 3.175 mm. The second portion 324 may include a same diameter size as the first portion 322 or may include a diameter that is smaller, shown in dotted lines, than that of the first portion 322. For example, the second portion 324 may include a diameter of about 3.0 mm. The smaller diameter of the second portion enables a smaller opening on the end wall 216 for the second portion 324 to pass through and for the larger first portion 322 to cover the opening.

The corners 270 on the repellent surface 232 are rounded (the corners 326 on the back surface 312 are similarly rounded). In some embodiments, the rounded corner 270 represents no more than ¼ of a perimeter of a circle. In some embodiments, the rounded corner 270 represents about ⅛ of a perimeter of a circle. The represented circle may have a diameter of about 4 mm or larger such that the rounded corner 270 is sufficiently smooth to avoid point discharge.

In some embodiments, a corner 332 between the back surface 312 and the edge 234 is also rounded, as shown in dotted line. A corner 334 between the repellent surface 232 and the edge 234 is also rounded, as shown in dotted line. In some embodiments, the rounded corner 332 represents no more than ¼ of a perimeter of a round. In some embodiments, the rounded corner 332 represents about ⅛ of a perimeter of a circle. The represented circle may have a diameter of about 4 mm or larger such that the rounded corner 332 is sufficiently smooth to avoid point discharge. In some embodiments, the rounded corner 334 represents about ⅛ of a perimeter of a circle. The represented circle may have a diameter of about 4 mm or larger such that the rounded corner 334 is sufficiently smooth to avoid point discharge. In some embodiments, a three-dimensional profile of a corner portion of the repellent electrode 230 combines or includes rounded corners 270, 332 and 334 and is substantially dome shaped. The dome-shaped corner portion helps to prevent electrical discharge.

In some embodiments, the repellent surface 232 is substantially rectangular with rounded corners 270. The repellent surface 232 includes a size of about 19 to about 21.5 mm in one dimension and about 25.5 to about 28 mm in another dimension. A surface area of the repellent surface 232 is about 484.5 mm² to about 602 mm². A thickness of the repellent body 310 in the z-axis is about 3 mm to about 3.75 mm.

In some embodiments, the shape of the repellent surface 232 follows that of the transversal plane 260 with a gap 262 being maintained as minimum, e.g., in a range between about 1 mm and about 2 mm or other minimized sizes based on other system configurations. For example, in a case that the transversal plane 260 is oval, the repellent surface 232 is also oval of substantially a same shape but with a smaller dimension. In a case that the transversal plane 260 is a polygonal shape having 3 sides or 5 or more sides, the repellent surface 232 is substantially the same polygonal shape with rounded corners and a smaller dimension. The gap 262 is maintained as minimum no matter the shape of the transversal plane 260 or the shape of the repellent surface 232.

Figure 4:
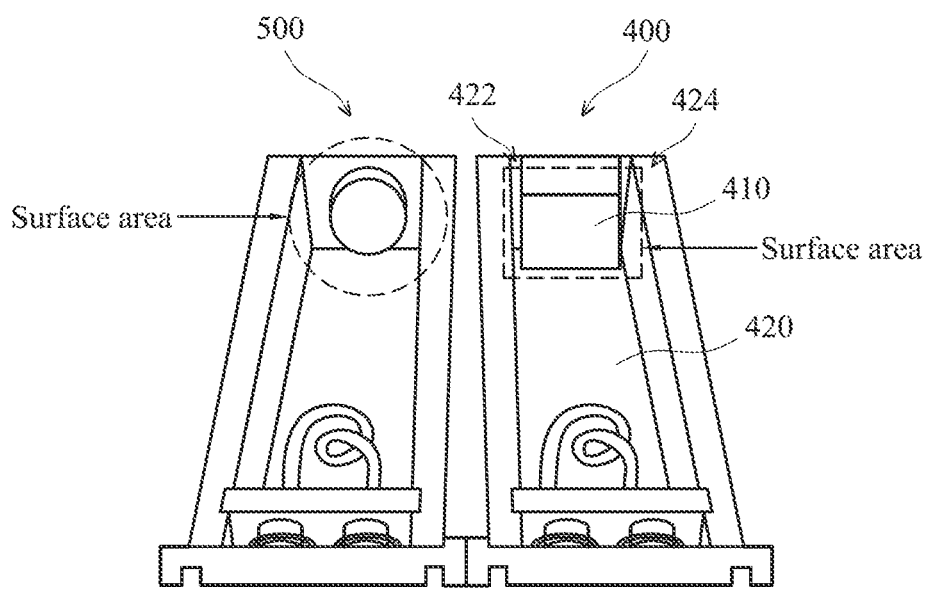
FIG. 4 is an exploded image of the example repellent electrode of FIG. 3 installed in a source arc chamber in comparison with a conventional repellent electrode.

FIG. 4 shows an exploded image of an example repellent electrode 400 of the disclosed technique as compared to an example round repellent electrode 500 installed in a same source arc chamber. As shown in FIG. 4, the round repellent electrode 500 does not mirror the source arc chamber as compared to the example repellent electrode 400. Because the shape of the repellent surface 410 of the repellent electrode 400 mirrors or matches the shape of the transversal plane 422 of the inner chamber space 420 of a source arc chamber, a gap 424 between the repellent surface 410 of the repellent electrode 400 and the sidewall of the source arc chamber is minimized. The surface area of the repellent electrode 400 is much larger than the surface area of the round repellent electrode 500. Because the shape of the repellent surface of the repellent electrode 500 does not fit or mirror the shape of the transversal plane where the repellent electrode 500 is positioned in, here round versus rectangular, the repellent electrode 500 is not able to minimize the gap between the conventional repellent electrode 500 and the sidewall of the source arc chamber. The example repellent electrode 400 increased the repellent surface area and the odds that electrons are repelled back toward the dopant gas in the source arc chamber to generate ions.

In the description herein, an example polygonal repellent surface 232 is described as having a rounded corner. Specifically, the rounded corner is convex. Other example embodiments are also possible and are included in the scope of the disclosure. For example, the meeting points between the sides of the substantially polygon-shaped repellent surface 232 may also be concaves. That is, the rounded corner may include concave portions toward a center of the repellent surface 232. The rounded shapes of the concave portions prevent electrical discharges from occurring. Other shapes of the meeting points between sides of the substantially polygon-shaped repellent surface 232 are also possible, which are configured to prevent electrical discharge from occurring at the meeting points.

Figure 5:
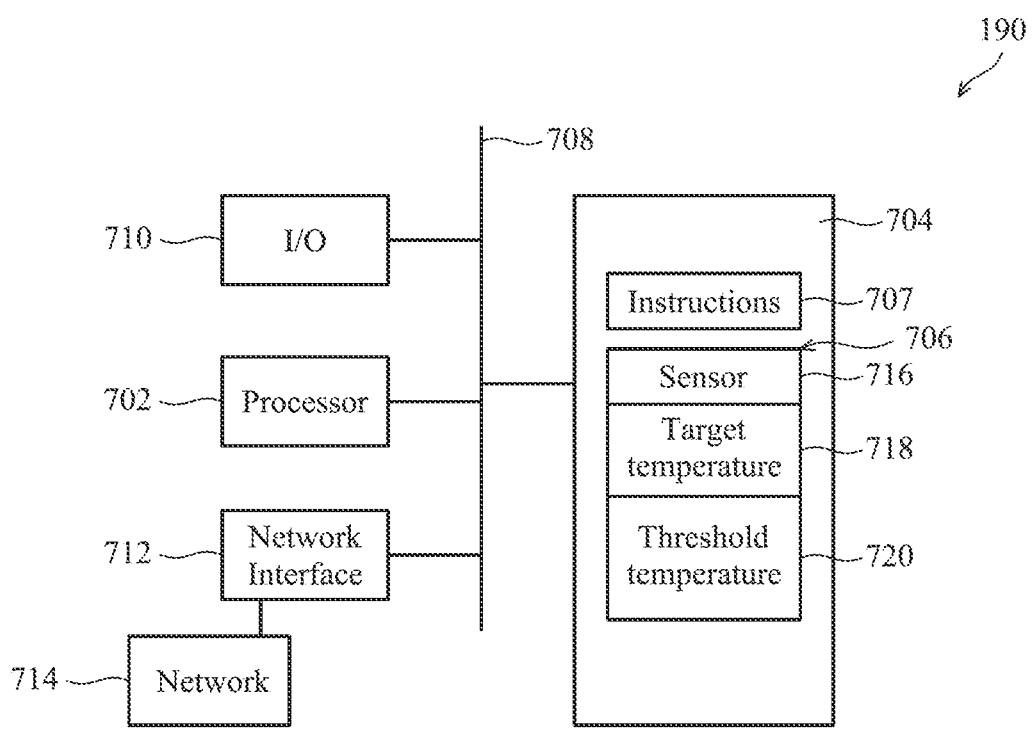
FIG. 5 is an example controller.

FIG. 5 shows a block diagram of an example controller 190 for controlling the ion implanter system 100 in accordance with some embodiments. Controller 190 includes a hardware processor 702 and a non-transitory, computer readable storage medium 704 encoded with, i.e., storing, computer program code 706, i.e., a set of executable instructions. Computer readable storage medium 704 is also encoded with instructions 707 for interfacing with components of ion implanter system 100. The processor 702 is electrically coupled to the computer readable storage medium 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and computer readable storage medium 704 are capable of connecting to external elements via network 714. The processor 702 is configured to execute the computer program code 706 encoded in the computer readable storage medium 704 in order to cause controller 190 to be usable for performing a portion or all of the operations as described with respect to Ion implanter system 100.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 704 includes a compact disk-read only memory (CD-ROM), a compact disk-read/write (CD-R/W), and/or a digital video disc (DVD).

In some embodiments, the storage medium 704 stores the computer program code 706 configured to cause controller 190 to perform the operations as described with respect to ion implanter system 100. In some embodiments, the storage medium 704 also stores information needed for performing the operations as described with respect to Ion implanter system 100, such as a sensor parameter 716, a target temperature parameter 718, a threshold temperature parameter 720 and/or a set of executable instructions to perform the operation as described with respect to Ion implanter system 100.

In some embodiments, the storage medium 704 stores instructions 707 for interfacing with Ion implanter system 100. The instructions 707 enable processor 702 to generate operating instructions readable by elements of the Ion implanter system 100 to effectively implement the operations as described with respect to Ion implanter system 100.

Controller 190 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

Controller 190 also includes network interface 712 coupled to the processor 702. Network interface 712 allows controller 190 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, the operations as described with respect to Ion implanter system 100 are implemented in two or more controllers 190, and information such as sensor information, conditioning iterations information, conditioner pressure and target roughness are exchanged between different controllers 190 via network 714.

Controller 190 is configured to receive information related to other components of the ion implanter system 100 through I/O interface 710. The information is transferred to processor 702 via bus 708 and then stored in computer readable medium 704 as sensor parameter 716. Controller 190 is configured to receive information related to the target temperature and threshold temperature through I/O interface 710. In some embodiments, the target and threshold temperature information is received from an operator. The information is stored in computer readable medium 704 as target temperature parameter 718 and threshold temperature parameter 720.

The advantages and features of the disclosure are further appreciable through the following example embodiments:

In some embodiments, an ion source of an ion implanter includes a source arc chamber having a conductive first end wall, a conductive second end wall, and a conductive sidewall defining an inner chamber space. A repellent electrode is positioned in the inner chamber space and is secured to the first end wall through a shaft element of an insulator material. The repellent electrode includes a repellent surface that substantially mirrors a shape of the inner chamber space in a transversal plane where the repellent surface is positioned with a gap space separating the repellent electrode from the conductive sidewall of the source arc chamber. A cathode electrode id positioned in the inner chamber space and is secured to one or more of the conductive second end wall or the conductive sidewall.

In some embodiments, an ion source of an ion implanter includes a source arc chamber having a conductive first end wall, a conductive second end wall, and a conductive sidewall partially defining an inner chamber space. A repellent electrode includes a repellent body and a shaft element. The repellent body is positioned within the inner chamber space. The shaft element passes through the first end wall and is secured to the source arc chamber. A gap space between the repellent body and the conductive sidewall of the source arc chamber is substantially uniform in size from different directions. A cathode electrode is positioned in the inner chamber space.

In some embodiments, an ion implanter includes an ion source module that generates ions. The ion source module includes a source arc chamber and a cathode electrode and a repellent electrode positioned within an inner chamber space of the source arc chamber. The repellent electrode includes a substantially rectangular repellent surface that fits the inner chamber space with a gap space between the repellent surface and the source arc chamber maintaining a size of less than 2 mm in all directions. An ion extracting module extracts the ions out of the ion source module.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
introducing ions into a substrate using an ion implanter, wherein the ion implanter has an ion source, the ion source including:
a source arc chamber having a conductive first end wall, a conductive second end wall, and a conductive sidewall defining an inner chamber space;
a repellent electrode positioned in the inner chamber space and secured to the first end wall through a shaft element of an insulator material, the repellent electrode including a repellent surface that substantially mirrors a shape of the inner chamber space in a transversal plane where the repellent surface is positioned with a gap space separating the repellent electrode from the conductive sidewall of the source arc chamber; and
a cathode positioned in the inner chamber space and secured to one or more of the conductive second end wall or the conductive sidewall.

2. The method of claim 1, wherein the shape of the inner chamber space in the transversal plane is substantially rectangular and the repellent surface is substantially rectangular and is smaller than the shape of inner chamber space in the transversal plane.

3. The method of claim 2, wherein each side of the repellent surface is smaller than a corresponding side the inner chamber space in the transversal plane by substantially a same amount.

4. The method of claim 3, wherein each side of the repellent surface is smaller than the corresponding side of the inner chamber space in the transversal plane by about 1 mm to about 2 mm.

5. The method of claim 1, wherein the repellent surface is tungsten.

6. The method of claim 1, wherein the shaft element includes a first portion and a second portion, the first portion being closer to the repellent surface than the second portion and including a larger diameter than the second portion.

7. The method of claim 6, wherein the first portion has a length less than a length of the second portion.

8. The method of claim 1, wherein the shaft element includes a ceramic material.

9. The method of claim 1, wherein the second end wall is opposite to the first end wall, and the cathode is secured to the second end wall.

10. The method of claim 1, wherein the cathode electrode includes a filament element.

11. A method, comprising:
operating an ion implanter that has an ion source, the ion source including:
a source arc chamber having a conductive first end wall, a conductive second end wall, and a conductive sidewall partially defining an inner chamber space;
a repellent electrode including a repellent body and a shaft element, the repellent body positioned within the inner chamber space, the shaft element passing through the first end wall and secured to the source arc chamber, a distance between the repellent body and the conductive sidewall of the source arc chamber being substantially uniform at different edge portions of the repellent body; and
a cathode electrode positioned in the inner chamber space.

12. The method of claim 11, wherein the inner chamber space is substantially rectangular in a transversal cross-sectional plane adjacent to the repellent body, and the repellent body is substantially rectangular and has a smaller area size than an area size of the inner chamber space in the transversal cross-sectional plane.

13. The method of claim 12, wherein the repellent body includes rounded corners.

14. The method of claim 13, wherein the repellent body includes a rounded corner on a surface of the repellent body.

15. The method of claim 13, wherein the repellent body includes a rounded corner between an edge and a surface of the repellent body.

16. The method of claim 11, wherein the repellent body includes a surface shape that mirrors a shape of the inner chamber space in a cross-sectional plane.

17. The method of claim 11, wherein the distance between the repellent body and the conductive sidewall of the source arc chamber is in a range between about 1 mm and about 2 mm.

18. The method of claim 11, wherein a surface of the repellent body is tungsten.

19. A method, comprising:
introducing ions into a wafer using an ion implanter, wherein the ion implanter includes:

an ion source module that in operation generates ions, the ion source module having:
    a source arc chamber having an inner chamber space;
    a cathode electrode positioned in the inner chamber space; and
    a repellent electrode positioned within the inner chamber space, the repellent electrode including a substantially rectangular repellent surface that fits within the inner chamber space with a distance between an edge of the repellent surface and an sidewall of the inner chamber space being less than about 2 mm; and
an ion extracting module that in operation extracts the ions out of the ion source module.

20. The method of claim 19, wherein the substantially rectangular repellent surface includes one or more rounded corners.

\* \* \* \* \*